(12) United States Patent
Cheng et al.

(10) Patent No.: US 10,867,816 B2
(45) Date of Patent: Dec. 15, 2020

(54) METHOD AND APPARATUS FOR WAFER BACKSIDE COOLING

(71) Applicant: Taiwan Semiconductor Manufacturing Co., Ltd., Hsinchu (TW)

(72) Inventors: Chung-Hsiu Cheng, New Taipei (TW); Young-Shuen Chou, Hsinchu (TW); I-Che Chiu, Taoyuan (TW); Tsung-Hao Lu, Hsinchu (TW); Ken Liao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 27 days.

(21) Appl. No.: 15/729,841

(22) Filed: Oct. 11, 2017

(65) Prior Publication Data
US 2018/0166305 A1 Jun. 14, 2018

Related U.S. Application Data

(60) Provisional application No. 62/433,271, filed on Dec. 13, 2016.

(51) Int. Cl.
*H01L 21/67* (2006.01)
*H01L 21/683* (2006.01)
*H01L 21/687* (2006.01)

(52) U.S. Cl.
CPC .. *H01L 21/67098* (2013.01); *H01L 21/67109* (2013.01); *H01L 21/67207* (2013.01); *H01L 21/6833* (2013.01); *H01L 21/68785* (2013.01)

(58) Field of Classification Search
CPC ............. B23K 3/085; H01L 21/67109; H01L 21/67207; H01L 21/6833; H01L 21/68785; H01L 21/02008
See application file for complete search history.

(56) References Cited

U.S. PATENT DOCUMENTS

| | | | | |
|---|---|---|---|---|
| 4,693,036 A | * | 9/1987 | Mori | B24B 37/30 451/287 |
| 2002/0130276 A1 | * | 9/2002 | Sogard | G03F 7/707 250/492.2 |
| 2013/0088809 A1 | * | 4/2013 | Parkhe | F28F 3/00 361/234 |
| 2017/0352568 A1 | * | 12/2017 | Cho | H01J 37/32706 |

* cited by examiner

*Primary Examiner* — Christine A Enad
(74) *Attorney, Agent, or Firm* — McClure, Qualey & Rodack, LLP

(57) ABSTRACT

A method for processing a semiconductor wafer is provided. The method includes placing a semiconductor wafer on a wafer chuck. The method further includes performing a process over the wafer. The method also includes supplying a cooling gas to the backside of the semiconductor wafer via a groove and a number of ventilation apertures located in the groove. Two of the neighboring ventilation apertures are separated in a circumferential direction relative to the center of the wafer chuck by a predetermined angle that is less than 90 degrees.

20 Claims, 6 Drawing Sheets

US 10,867,816 B2

METHOD AND APPARATUS FOR WAFER BACKSIDE COOLING

PRIORITY CLAIM AND CROSS-REFERENCE

This application claims the benefit of U.S. Provisional Application No. 62/433,271, filed on Dec. 13, 2016, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that take up less area than the packages of the past, in some applications.

During the manufacturing of semiconductor devices, various processing steps, such as a plasma (dry) etching process, are used to fabricate integrated circuits on a semiconductor wafer. In plasma (dry) etching, the etch reaction is affected by the wafer temperature, and hence local gradients in the wafer temperature may result in differing etching rates thereby resulting in different critical dimension (CD) uniformity over the wafer surface.

Thus, there is a need in the semiconductor processing art to develop an improved wafer temperature control method for use in a plasma etching process to compensate for CD non-uniformity and achieve repeatable and predictable CD uniformity.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
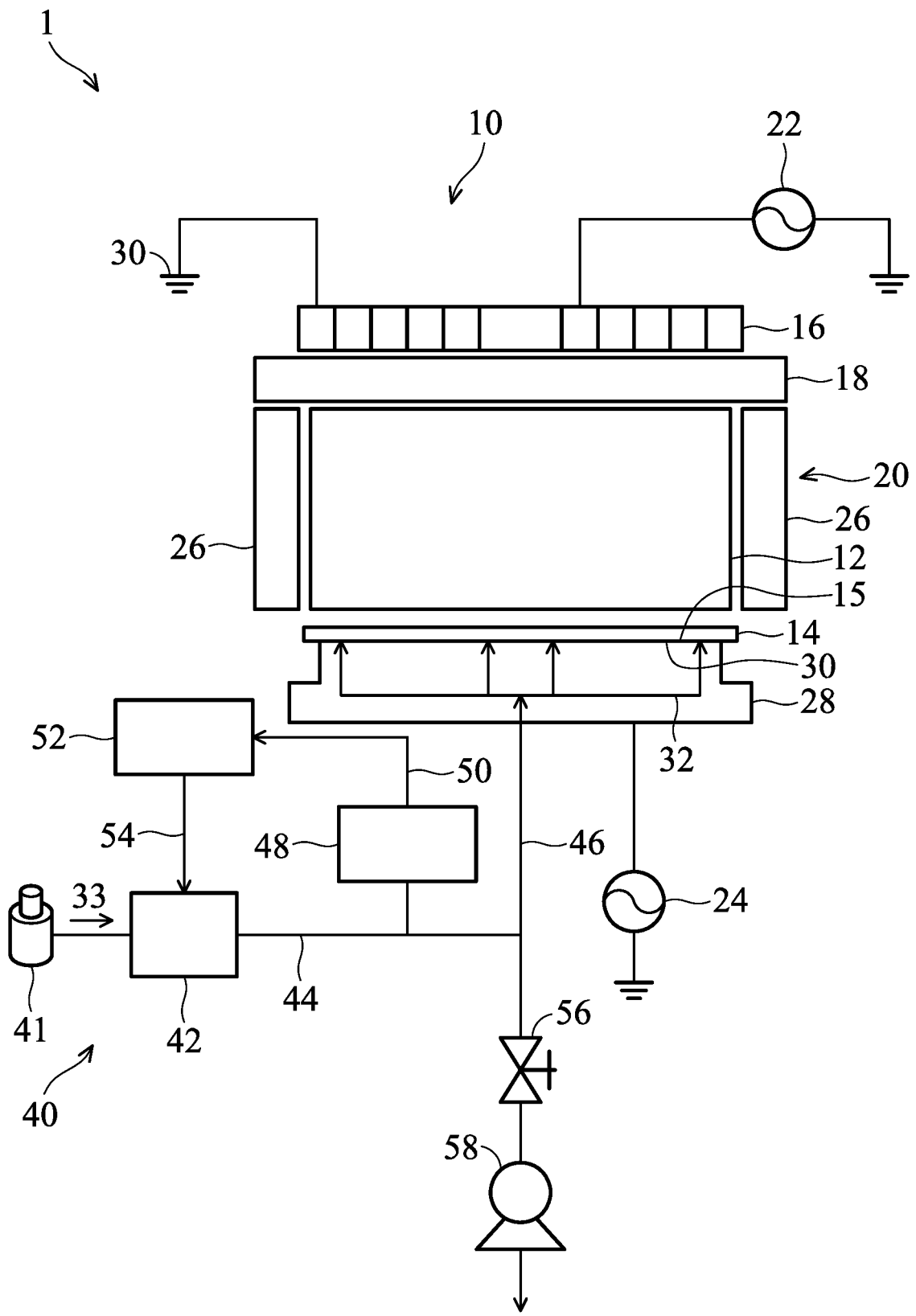
FIG. 1 shows a schematic view of a process apparatus, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be performed before, during, and after the method, and some of the operations described can be replaced or eliminated for other embodiments of the method.

FIG. 1 shows a schematic view of an apparatus 1 for processing a semiconductor wafer 14, in accordance with some embodiments. In some embodiments, the apparatus 1 includes a plasma etcher 10, a wafer chuck 28, and a cooling gas supply module 40. The elements of the apparatus 1 can be added to or omitted, and the invention should not be limited by the embodiment.

In some embodiments, the plasma etcher 10 includes a transformer-coupled plasma source 16 for generating high-density plasma 12 decoupled from the semiconductor wafer 14. The transformer-coupled plasma source 16 that is separated from the plasma 12 by a dielectric plate 18, or a dielectric window on top of the reactor chamber 20. The transformer-coupled plasma source 16 allows independent control of ion flux and ion energy and, for example, includes a flat spiral coil, so as to generate plasma 12 in the reactor chamber 20.

In some embodiments, the plasma etcher 10 further includes an inductive supply 22, a bias supply 24 and a number of multi-pole magnets 26. The inductive supply 22 and the bias supply 24 are used to generate the necessary plasma field. The multi-pole magnets 26 are used to surround the plasma 12 generated.

The wafer chuck 28 is configured for supporting the semiconductor wafer 14 in the plasma etcher 10. In some embodiments, the wafer chuck 28 is an E-chuck. The E-chuck electrostatically attracts and holds the semiconductor wafer 14 that is positioned on the top surface 30 thereof. The wafer chuck 28 may be constructed of either a metallic material or of a polymeric material.

In some embodiments, a passage 32 is formed in the wafer chuck 28 to allow the cooling gas 33 to pass from the cooling gas supply module 40 and to guide the cooling gas 33 to the top surface 30 of the wafer chuck 28.

Figure 2:
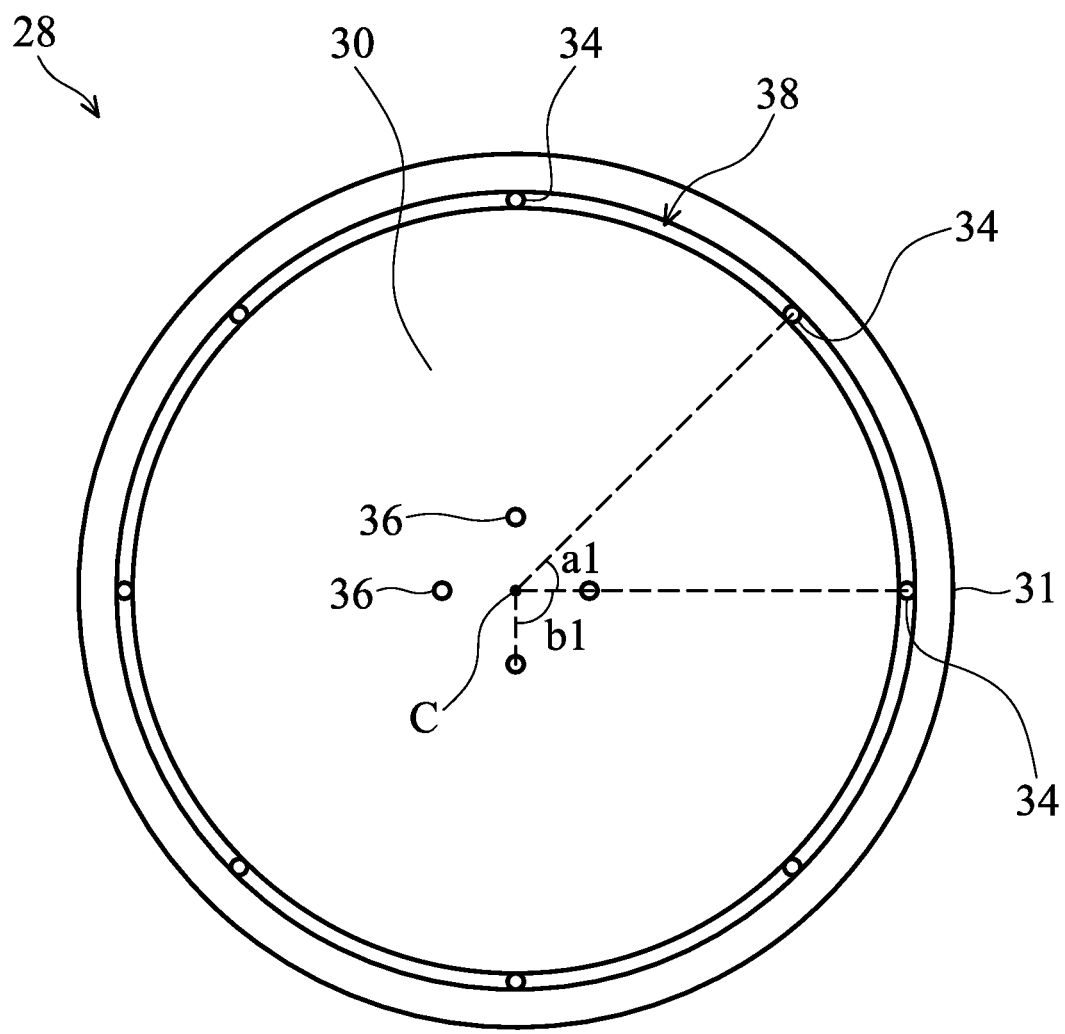
FIG. 2 shows a top view of a wafer chuck, in accordance with some embodiments.

FIG. 2 shows a top view of the wafer chuck 28, in accordance with some embodiments. Referring to FIG. 2 with reference to FIG. 1, in some embodiments, the passage 32 is fluidly connected to a number of vas, such as the first ventilation apertures 34 and the second ventilation apertures 36, formed on the top surface 30 of the wafer chuck 28. The cooling gas 33 passing through the passage 32 is ejected to the outside of the wafer chuck 28 via the first and second ventilation apertures 34 and 36. The arrangements of the first ventilation apertures 34 and the second ventilation apertures 36 are described below.

In some embodiments, more than four first ventilation apertures 34 are formed on the top surface 30 of the wafer chuck 28, and each two of the neighboring first ventilation apertures 34 are evenly separated in a circumferential direction relative to the center C of the wafer chuck 28 by a predetermined angle that is less than 90 degrees.

For example, as shown in FIG. 2, there are eight first ventilation apertures 34 formed on the top surface 30 of the wafer chuck 28. The eight first ventilation apertures 34 are arranged in a circle and positioned adjacent to the edge 31 of the wafer chuck 28. Each two neighboring first ventilation apertures 34 are separated in a circumferential direction relative to the center C of the wafer chuck 28 by a first predetermined angle a1. The first predetermined angle a1 is about 45 degrees.

In some embodiments, there are four second ventilation apertures 36 formed on the top surface 30 of the wafer chuck 28. The four second ventilation apertures 36 are arranged in a circle and positioned adjacent to the center C of the wafer chuck 28 so that the second ventilation apertures 36 are closer to the center C of the wafer chuck 28 than the first ventilation apertures 34.

In some embodiments, each two neighboring second ventilation apertures 36 are evenly separated in a circumferential direction relative to the center C of the wafer chuck 28 by a second predetermined angle b1. The second predetermined angle b1 is greater than the first predetermined angle a1. In some embodiments, the second predetermined angle b1 is about 90 degrees.

In some embodiments, a circular groove 38 is formed on the top surface 30 of the wafer chuck 28 along the circle on which the first ventilation apertures 34 are located. The center of the circular groove 38 overlaps with the center C of the wafer chuck 28. The first ventilation apertures 34 are formed on the bottom of the groove 38.

In some embodiments, the width of the groove 38 is greater than the width of each of the first ventilation apertures 34. In some embodiments, the width of the groove is in a range from about 2.0 mm to about 3.0 mm, and the ratio of the width of the first ventilation apertures 34 to the width of the groove 38 is lower than 0.7. However, it should be appreciated that many variations and modifications can be made to embodiments of the disclosure. In some embodiments, the groove 38 is omitted.

Referring to FIG. 1, the cooling gas supply module 40 is configured to supply cooling gas 33 into the wafer chuck 28. In some embodiments, the cooling gas supply module 40 includes a cooling gas source 41, a flow control valve 42, a gas supply line 44 and a cooling gas inlet conduit 46.

In some embodiments, the cooling gas inlet conduit 46 for feeding the cooling gas 33 into the ventilation apertures is connected to the passage 32. The cooling gas inlet conduit 46 is in turn connected to the gas supply line 44, the flow control valve 42 and the cooling gas source 41.

In some embodiments, the pressure in the gas supply line 44 is monitored by a pressure sensing device 48 which in turn sends a signal 50 to a controller 52. The controller 52, after receiving a signal 50 and comparing it to a pre-stored value, sends the signal 54 to the flow control valve 42 to open or close the flow control valve 42, thereby increasing or decreasing the cooling gas 33 supply through the supply lines 44 and the cooling gas inlet conduit 46 into the wafer chuck 28. In some embodiments, the amount of cooling gas 33 supplied to the wafer chuck 28 is adjusted further using a needle valve 56 and then pumped away by a pump 58.

It should be noted that the number of first ventilation apertures 34 and second ventilation apertures 36 should not be limited to the above embodiments and may vary depending on intended use or design parameters. A greater or lesser number of ventilation apertures may be provided. Some exemplary embodiments are provided below.

Figure 3:
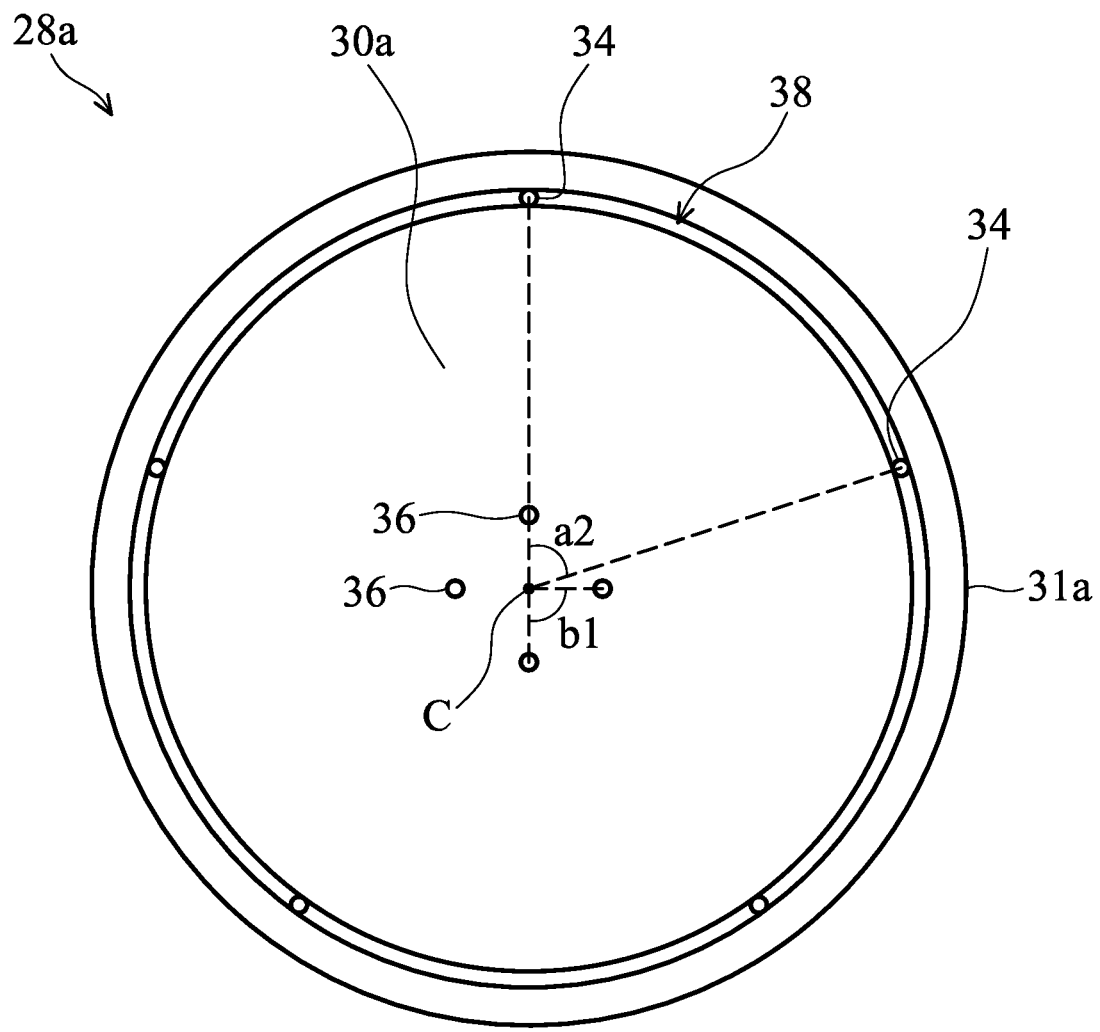
FIG. 3 shows a top view of a wafer chuck, in accordance with some embodiments.

FIG. 3 shows a top view of a wafer chuck 28a, in accordance with some embodiments. In the embodiments of FIG. 3, elements that are similar to those of the embodiments of FIG. 2 are provided with the same reference numbers, and the features thereof are not repeated in the interest of brevity.

In some embodiments, there are five first ventilation apertures 34 formed on the top surface 30a of the wafer chuck 28a. The five first ventilation apertures 34 are arranged in a circle and positioned adjacent to the edge 31a of the wafer chuck 28a. Each two neighboring first ventilation apertures 34 are separated in the circumferential direction relative to the center C of the wafer chuck 28a by a first predetermined angle a2. The first predetermined angle a2 is smaller than the second predetermined angle b1 by which the second ventilation apertures 36 are separated in the circumferential direction. In some embodiments, the first predetermined angle a2 is about 72 degrees and the second predetermined angle b1 is about 90 degrees.

Figure 4:
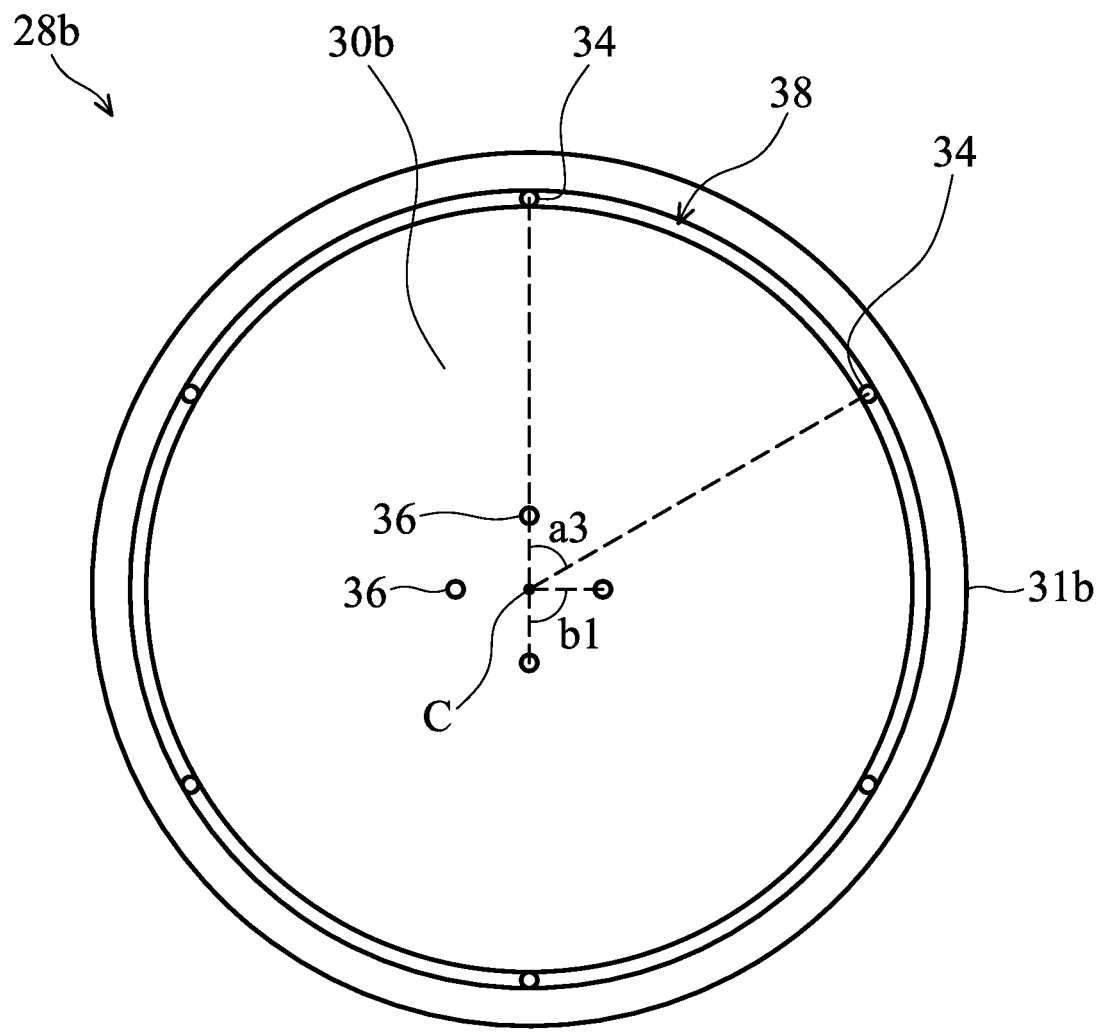
FIG. 4 shows a top view of a wafer chuck, in accordance with some embodiments.

FIG. 4 shows a top view of a wafer chuck 28b, in accordance with some embodiments. In the embodiments of FIG. 4, elements that are similar to those of the embodiments of FIG. 2 are provided with the same reference numbers, and the features thereof are not repeated in the interest of brevity.

In some embodiments, there are six first ventilation apertures 34 formed on the top surface 30b of the wafer chuck 28b. The six first ventilation apertures 34 are arranged in a circle and positioned adjacent to the edge 31b of the wafer chuck 28b. Each two neighboring first ventilation apertures 34 are separated in the circumferential direction relative to the center C of the wafer chuck 28b by a first predetermined angle a3. The first predetermined angle a3 is smaller than the second predetermined angle b1 by which the second ventilation apertures 36 are separated in the circumferential direction. In some embodiments, the first predetermined angle a3 is about 60 degrees and the second predetermined angle b1 is about 90 degrees.

Figure 5:
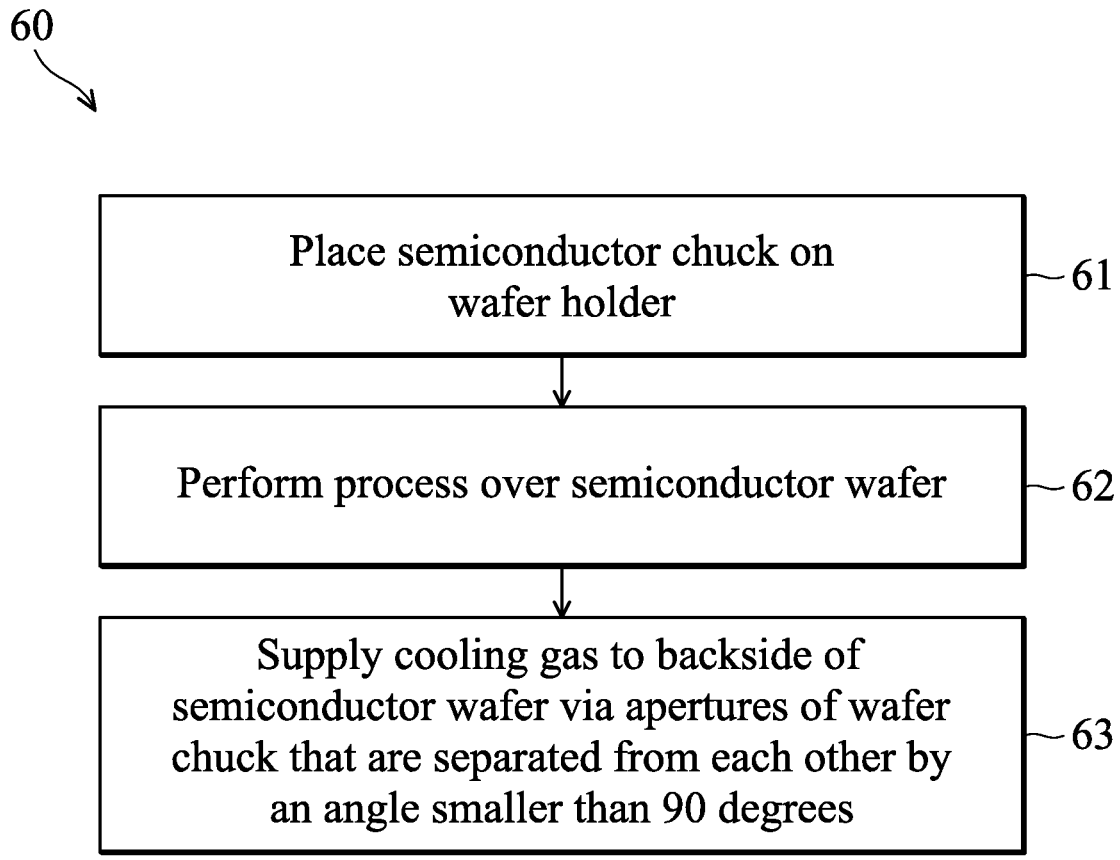
FIG. 5 shows a flow chart illustrating a method for cooling a semiconductor wafer, in accordance with some embodiments.

FIG. 5 is a flow chart illustrating a method 60 for processing a semiconductor wafer 14, in accordance with some embodiments. For illustration, the flow chart will be described along with the drawings shown in FIGS. 1-2 which show schematic views of the apparatus 1. Some of the described stages can be replaced or eliminated in different embodiments. Additional features can be added to the semiconductor device structure. Some of the features described below can be replaced or eliminated in different embodiments.

The method 60 begins with operation 61, as shown in FIG. 1, a semiconductor wafer 14 is placed on the wafer chuck 28. The semiconductor wafer 14 may be made of silicon or another semiconductor material. Alternatively or additionally, the semiconductor wafer 14 may include other elementary semiconductor materials such as germanium (Ge). In some embodiments, the semiconductor wafer 14 is made of a compound semiconductor such as silicon carbide (SiC), gallium arsenic (GaAs), indium arsenide (InAs), or indium phosphide (InP). In some embodiments, the semiconductor wafer 14 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 14 includes an epitaxial layer. For example, the semiconductor wafer 14 has an epitaxial layer overlying a bulk semiconductor. In some other embodiments, the semiconductor wafer 14 may be a silicon-on-insulator (SOI) or a germanium-on-insulator (GOI) substrate.

The semiconductor wafer 14 may have various device elements. Examples of device elements that are formed in the semiconductor wafer 14 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, when the semiconductor wafer 14 is placed on the wafer chuck 28, the backside 15 of the semiconductor wafer 14 is in contact with the top surface 30 of the wafer chuck 28 by electrostatic force. In some embodiments, the semiconductor wafer 14 is positioned away from the flat spiral coil 16 so that it is not affected by the electromagnetic field generated by the flat spiral coil 16.

The method 60 continues with operation 62, in which a process is conducted over the semiconductor wafer 14. In some embodiments, the semiconductor wafer 14 is undergoing a plasma (dry) etching process by the plasma etcher 10. A source frequency of 13.56 MHZ and a substrate bias frequency of 13.56 MHZ may be utilized. In addition, an ion density of approximately $0.5~2\times10^{12}$ cm$^3$ at the semiconductor wafer, an electron temperature of 3.5~6 eV and a chamber pressure of 1~25 m Torr may be achieved or used.

The method 60 continues with operation 63, in which cooling gas 33 is supplied to the backside 15 of the semiconductor wafer 14 via ventilation apertures 34 and 36 of the wafer chuck 28. In some embodiments, the cooling gas 33 is fed into the passage 32 of the wafer chuck 28 through the flow control valve 42, the gas supply line 44, and cooling gas inlet conduit 46. Afterwards, the cooling gas 33 is introduced into a gap between the top surface 30 of the wafer chuck 28 and the backside 15 through ventilation apertures 34 and 36. As a result, the backside 15 of the semiconductor wafer 14 is cooled by the cooling gas 33. In addition, a more uniform temperature of the semiconductor wafer 14 is achieved by transferring heat to the wafer chuck 28.

In some embodiments, when the cooling gas 33 is discharged by the first ventilation apertures 34, at least a portion of the cooling gas 33 flows into the groove 38 and flows along the circumferential direction of the wafer chuck 28. Afterwards, before leaving the groove 38, the cooling gas 33 flows along the groove 38 in a direction from one of the first ventilation apertures 34 to the two neighboring first ventilation apertures 34, thereby prolonging the time during which the cooling gas 33 remains between the backside 15 of the semiconductor wafer 14 and the wafer chuck 28, and more heat can be taken away from the semiconductor wafer 14 by the cooling gas 33.

The flow volume of the cooling gas 33 supplied to the backside 15 of the semiconductor wafer 14 via the first ventilation apertures 34 may be the same or different from the flow volume of the cooling gas 33 supplied to the backside 15 of the semiconductor wafer 14 via the second ventilation apertures 36. In some embodiments, the flow volume of the cooling gas 33 supplied to the backside 15 of the semiconductor wafer 14 via the first ventilation apertures 34 is greater than the flow volume of the cooling gas 33 supplied to the backside 15 of the semiconductor wafer 14 via the second ventilation apertures 36. As a result, a condition of the edge region of the semiconductor wafer 14 having a higher temperature than the center region of the semiconductor wafer 14 can be efficiently prevented.

In some embodiments, the cooling gas 33 for purging the backside of a wafer may be helium. However, it should be appreciated that many variations and modifications can be made to embodiments of the disclosure. The cooling gas 33 can be any other suitable inert gas.

Figure 6:
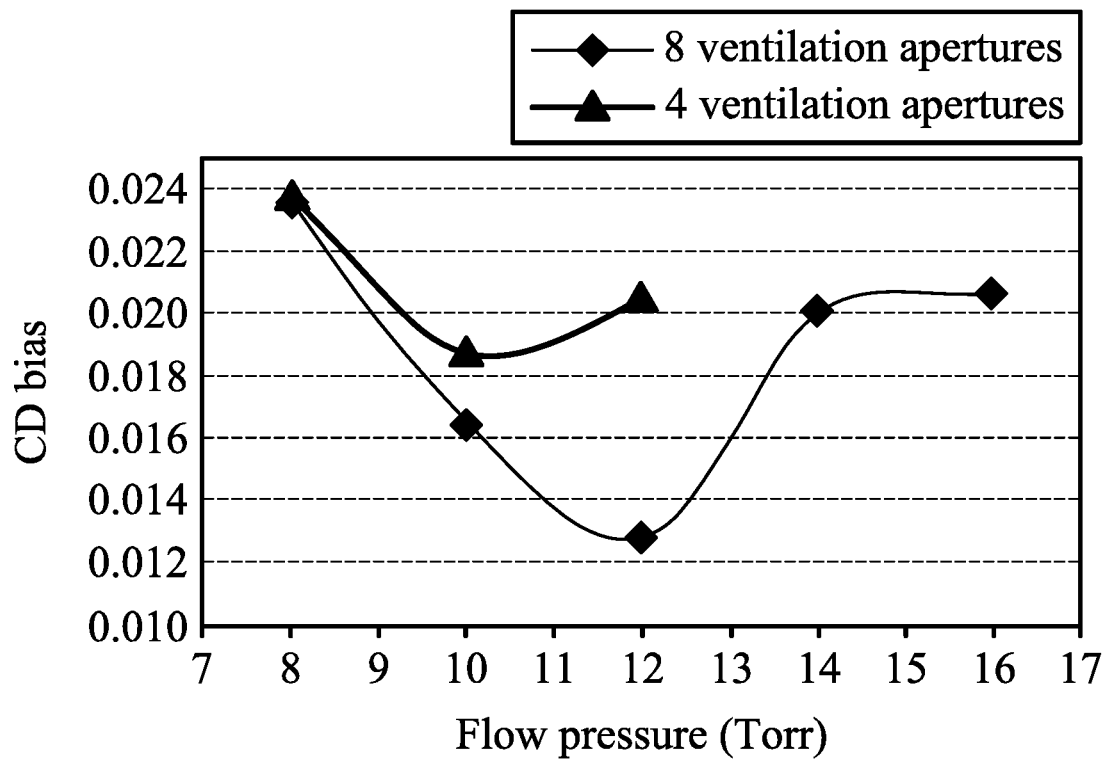
FIG. 6 is a graph illustrating the dependencies of flowing pressure of cooling gas and the CD range, in accordance with some embodiments.

The pressure of the cooling gas 33 applied to the wafer chuck 28 may be modified depending on the number of ventilation apertures formed on the wafer chuck 28. For example, as shown in FIG. 6, in cases where four first ventilation apertures 34 and four second ventilation apertures 36 are formed on the wafer chuck 28, the critical dimension (CD) bias is minimized as the flow pressure of the cooling gas 33 is at about 10 Torr. In the embodiments shown in FIG. 2, the CD bias range is minimized (about 0.0128) as the flow pressure of the cooling gas 33 is at about 12 Torr. In addition, the CD bias range is advantageously lower than 0.016, when the flow pressure of the cooling gas 33 is applied to the wafer chuck 28 at a pressure of about 10 Torr to about 13 Torr.

It should be appreciated that while the semiconductor wafer is cooled on the wafer chuck mounted in an apparatus for performing a plasma etching process, the disclosure should not be limited thereto. The method and the apparatus including the wafer chuck and the cooling module may be utilized in other processes in which the wafer temperature is increased during processing and/or the result of the process is correlated to wafer temperature.

Embodiments are provided of an apparatus and method for processing a semiconductor wafer that supplies cooling gas to the backside of the semiconductor wafer via multiple ventilation apertures arranged in a groove formed on the wafer chuck. Since the temperature of the outer edge of the semiconductor wafer can be decreased efficiently, the wafer temperature can be prevented from varying over the diameter of the wafer. Therefore, the critical dimension (CD) non-uniformities, which are caused by concentric temperature variations from wafer center to edge, are avoided. In addition, with the improvement in CD uniformity, better electrical parameters of the devices formed on the semiconductor wafer can be realized. According to one exemplary embodiment, the Isat sigma is improved 17% and the VT sigma is improved 15%. Moreover, due to the improvement in uniformity, lithography extending exposure loading is reduced, and the manufacturing cost is also reduced.

In accordance with some embodiments, an apparatus for processing a semiconductor wafer is provided. The apparatus includes a wafer chuck for holding a semiconductor wafer thereon. A groove is formed on the wafer chuck, and a number of first ventilation apertures are located in the groove. Two of the neighboring first ventilation apertures are separated in a circumferential direction relative to a center of the wafer chuck by a first predetermined angle, and the first predetermined angle is less than 90 degrees. The apparatus also includes a cooling gas supply module. The cooling gas supply module is connected to the first ventilation apertures and configured to supply a cooling gas to a backside of the semiconductor wafer.

In accordance with some embodiments, an apparatus for processing a semiconductor wafer is provided. The apparatus includes a wafer chuck for holding a semiconductor wafer thereon. A groove is formed on the wafer chuck, and a number of first ventilation apertures is located in the groove. A ratio of the width of the first ventilation apertures to the width of the grooves is lower than 0.7. The apparatus also includes a cooling gas supply module. The cooling gas supply module is connected to the first ventilation apertures and configured to supply a cooling gas to a backside of the semiconductor wafer.

In accordance with some embodiments, a method for processing a semiconductor wafer is provided. The method includes placing a semiconductor wafer on a wafer chuck. The method further includes performing a process over the wafer. The method also includes supplying a cooling gas to a backside of the semiconductor wafer via a groove and a number of ventilation apertures located in the groove. Two of the neighboring ventilation apertures are separated in a circumferential direction relative to the center of the wafer chuck by a predetermined angle that is less than 90 degrees.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus for processing a semiconductor wafer, comprising:
   a wafer chuck for holding a semiconductor wafer thereon, wherein a groove is formed on the wafer chuck, and a plurality of first ventilation apertures are located in the groove, wherein two of the neighboring first ventilation apertures are separated in a circumferential direction relative to a center of the wafer chuck by a first predetermined angle, and the first predetermined angle is less than 90 degrees; and
   a cooling gas supply module connected to the first ventilation apertures and configured to supply a cooling gas to a backside of the semiconductor wafer;
   wherein the apparatus further comprises a plurality of second ventilation apertures which are arranged in a circle and positioned adjacent to the center of the wafer chuck, and the cooling gas is ejected to the outside of the wafer chuck via the first ventilation apertures and the second ventilation apertures in the same direction;
   wherein a flow volume of the cooling gas supplied to the backside of the semiconductor wafer via the first ventilation apertures is different from a flow volume of the cooling gas supplied to the backside of the semiconductor wafer via the second ventilation apertures.

2. The apparatus as claimed in claim 1, wherein the number of first ventilation apertures is greater than 4.

3. The apparatus as claimed in claim 1, wherein the number of first ventilation apertures is 8.

4. The apparatus as claimed in claim 1, wherein a ratio of a width of the first ventilation apertures to a width of the groove is lower than 0.7.

5. The apparatus as claimed in claim 1, wherein a width of the groove is in a range from about 2.0 mm to about 3.0 mm.

6. The apparatus as claimed in claim 1, wherein the plurality of second ventilation apertures are arranged closer to the center of the wafer chuck than the first ventilation apertures.

7. The apparatus as claimed in claim 6, wherein two of the neighboring second ventilation apertures are separated in the circumferential direction relative to the center of the wafer chuck by a second predetermined angle, and the second predetermined angle is greater than the first predetermined angle.

8. The apparatus as claimed in claim 1, wherein the plurality of second ventilation apertures are not positioned on the center of the wafer chuck.

9. An apparatus for processing a semiconductor wafer, comprising: a wafer chuck for holding a wafer thereon, wherein a groove is formed on the wafer chuck and a plurality of first ventilation apertures are located in the groove, wherein a ratio of a width of the first ventilation apertures to a width of the grooves is lower than 0.7; and a cooling gas supply module connected to the first ventilation apertures and configured to supply a cooling gas to a backside of the semiconductor wafer; wherein the apparatus further comprises a plurality of second ventilation apertures which are positioned adjacent to the center of the wafer, and the first ventilation apertures are arranged in a circle and positioned adjacent to an edge of the wafer chuck, wherein the cooling gas is ejected to the outside of the wafer chuck via the first ventilation apertures and the second ventilation apertures in the same direction for dissipating heat of the wafer; wherein distances between a center of the wafer chuck and the second ventilation apertures are equal, wherein ventilation apertures are not positioned on the center of the wafer chuck.

10. The apparatus as claimed in claim 9, wherein the width of the groove is in a range from about 2.0 mm to about 3.0 mm.

11. The apparatus as claimed in claim 9, wherein the number of first ventilation apertures is greater than 4.

12. The apparatus as claimed in claim 9, wherein the number of first ventilation apertures is 8.

13. The apparatus as claimed in claim 9, wherein two of the neighboring first ventilation apertures are separated in a circumferential direction relative to a center of the wafer chuck by a first predetermined angle, the first predetermined angle being less than 90 degrees.

14. The apparatus as claimed in claim 9, wherein the plurality of second ventilation apertures arranged closer to the center of the wafer chuck than the first ventilation apertures.

15. The apparatus as claimed in claim 14, wherein two of the neighboring second ventilation apertures are separated in the circumferential direction relative to the center of the wafer chuck by a second predetermined angle, and the second predetermined angle is greater than the first predetermined angle.

16. A method for processing a semiconductor wafer, comprising: placing the semiconductor wafer on the wafer chuck; performing a process over the semiconductor wafer; supplying a cooling gas to a backside of the semiconductor wafer via a groove and a plurality of first ventilation apertures located in the groove, wherein two of the neighboring first ventilation apertures are separated in a circumferential direction relative to a center of the wafer chuck by a predetermined angle, the predetermined angle being less than 90 degrees; and supplying the cooling gas to the backside of the semiconductor wafer via a plurality of second ventilation apertures arranged closer to the center of the wafer chuck than the first ventilation apertures, wherein the cooling gas is ejected to the outside of the wafer chuck via the first ventilation apertures and the second ventilation apertures to the backside of the semiconductor wafer in the same direction; wherein the plurality of second ventilation apertures which are arranged in a circle and positioned adjacent to the center of the wafer, and the first ventilation apertures are arranged in a circle and positioned adjacent to an edge of the wafer chuck, wherein the ventilation apertures are not positioned on the center of the wafer chuck.

17. The method as claimed in claim 16, wherein pressure of the cooling gas is about 8 Torr to about 14 Torr.

18. The method as claimed in claim 16, wherein pressure of the cooling gas is about 12 Torr.

19. The method as claimed in claim 16, wherein the cooling gas is supplied to the backside of the semiconductor via eight first ventilation apertures.

20. The method as claimed in claim 16, wherein the cooling gas in the groove flows in a circumferential direction of the wafer chuck;
   wherein a ratio of a width of the first ventilation apertures to a width of the grooves is lower than 0.7.

* * * * *